(12) United States Patent
Lussenden

(10) Patent No.: US 6,707,709 B1
(45) Date of Patent: Mar. 16, 2004

(54) THREE TRANSISTOR SRAM

(75) Inventor: Jeffrey Lussenden, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 4 days.

(21) Appl. No.: 10/418,559

(22) Filed: Apr. 16, 2003

(51) Int. Cl.[7] .............................................. G11C 11/00
(52) U.S. Cl. ....................................... 365/154; 365/156
(58) Field of Search ................................. 365/154, 155, 365/156

(56) References Cited

U.S. PATENT DOCUMENTS 6,205,049 B1 * 3/2001 Lien et al. ................. 365/154

\* cited by examiner

*Primary Examiner*—Tan T. Nguyen
(74) *Attorney, Agent, or Firm*—The Law Offices of William W. Cochran, LLC

(57) ABSTRACT

A static random access element is comprised of three transistors and two resistors. Two transistors have their gates and drains cross connected to the respective drains and gates of the opposite transistor. Two resistors make the connection from a power supply to the drains of each of the two transistors. A first control line is connected at the junction of the two resistors. The source of a third transistor is connected to the gate of one of the first transistors and the drain of the third transistor is connected to a second control line and a power supply. The gate of the third transistor is connected to a third control line. The three transistor SRAM cell is more compact and requires fewer control lines than typical SRAM cells.

6 Claims, 3 Drawing Sheets

THREE TRANSISTOR SRAM

BACKGROUND OF THE INVENTION a. Field of the Invention

The present invention pertains to computer memory devices and specifically to static random access memory devices.

b. Description of the Background

Random access memory devices exist in many variations. Static random access memory ('SRAM') devices are a class of memory devices that require a constant power source so that the devices maintain the memory. Such devices are used in discrete packages or may be incorporated into integrated circuit devices that may, for example, include processors or other functionality.

A common SRAM device known in the art is comprised of six transistors. In addition to power supplies and ground connections, four control lines are required to operate the six transistor device.

One limitation of the common six transistor design are that the six transistors occupy a certain amount of area within an integrated circuit or other package.

Another limitation is that four control lines are required to operate the device. Each control line is a mechanism whereby noise or other problems may be introduced into the circuit.

It may therefore be advantageous to provide an SRAM device that has a smaller footprint than existing SRAM devices. It would further be advantageous to provide an SRAM device that eliminates one or more of the control lines necessary to operate the device.

SUMMARY OF THE INVENTION

The present invention overcomes the disadvantages and limitations of the prior art by providing a system and method for a static random access memory that is comprised of three transistors and two resistors. The transistors and resistors are connected to a voltage source VDD, ground VCC, a word line WL, a bit line BL, and a second bit line BLB. Operating WL, BL, and BLB in specific sequences controls the device. Further, the state of the device may be queried by raising the WL line and reading the state on the BL line.

The present invention may therefore comprise a static random access memory device comprising: a first transistor having a drain, a gate, and a source; a second transistor having a drain connected to the gate of the first transistor and a gate connected to the drain of the first transistor; a ground signal connected to the source of the first transistor and the source of the second transistor; a third transistor having a drain, a gate, and a source, the drain of the third transistor connected to the drain of the first transistor, a first resistor having a first connection and a second connection, the first connection of the first resistor being connected to the drain of the first transistor; a second resistor having a first connection and a second connection, the first connection of the second resistor being connected to the drain of the second transistor; a first power supply being connected to the second connection of the first resistor and the second connection of the second resistor; a second power supply being connected to the source of the third transistor; a first signal line connected to the gate of the third transistor; a second signal line connected to the second connection of the first resistor; and a third signal line connected to the source of the third transistor.

The present invention may further comprise a method of manufacturing a static random access memory device comprising: providing a first transistor having a drain, a gate, and a source; providing a second transistor having a drain, a gate, and a source; connecting the drain of the second transistor to the gate of the first transistor; connecting the drain of the first transistor to the gate of the second transistor, providing a ground signal; connecting the ground signal to the source of the first transistor and the source of the second transistor; providing a third transistor having a drain, a gate, and a source; connecting the drain of the third transistor to the drain of the first transistor; providing a first resistor having a first connection and a second connection; connecting the first connection of the first resistor to the drain of the first transistor; providing a second resistor having a first connection and a second connection; connecting the first connection of the second resistor to the drain of the second transistor, providing a first power supply; connecting the second connection of the first resistor and the second connection of the second resistor to the first power supply; providing a second power supply, connecting the source of the third transistor to the second power supply; providing a first signal line; connecting the first signal line to the gate of the third transistor; providing a second signal line; connecting the second signal line to the second connection of the first resistor; providing a third signal line; and connecting the third signal line to the source of the third transistor.

The advantages of the present invention are that fewer transistor devices are required to create an SRAM cell, leading to a reduced footprint for the equivalent functionality of other designs. Further, a reduction in the number of control wires results in the present invention being less susceptible to noise and other interference.

DETAILED DESCRIPTION OF THE INVENTION

Figure 1:
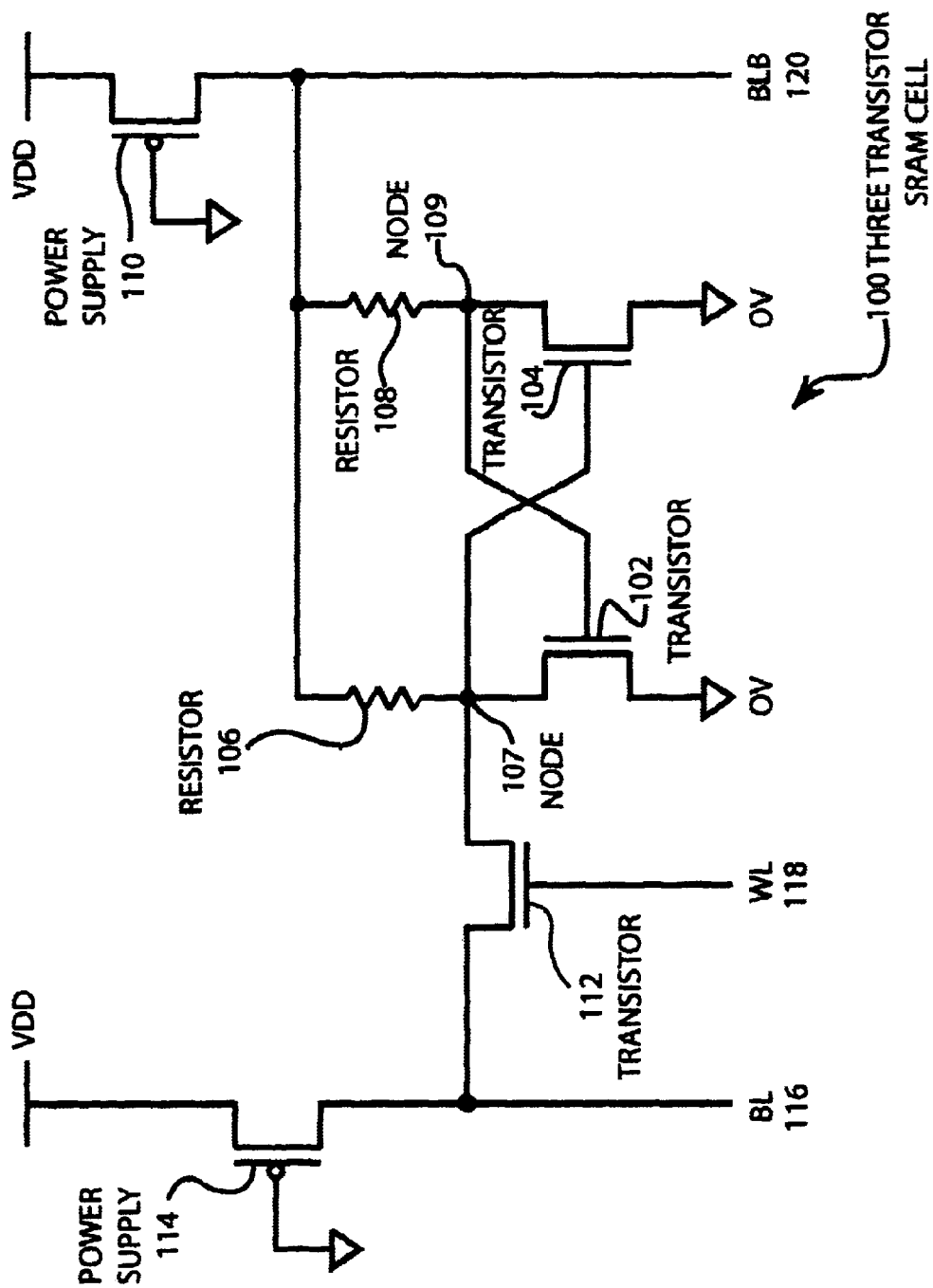
FIG. 1 is an illustration of an embodiment of the present invention of a three transistor static random access memory cell.

FIG. 1 illustrates an embodiment 100 of the present invention of a three transistor static random access memory cell. The transistor 102 has the gate connected to the drain of transistor 104. Likewise, the gate of transistor 104 is connected to the drain of transistor 102. The sources of transistors 102 and 104 is ground. Resistor 106 is connected to the drain of transistor 106 at node 107. Similarly, resistor 108 is connected to the drain of transistor 108 at node 109. Resistors 106 and 108 are connected to a current limiting power supply 110 and control line BLB 120. The drain of transistor 112 is connected to node 107. The gate of transistor 112 is connected to control line 118. The source of transistor 112 is connected to a current limiting power supply and control line BL 116.

The transistors 102 and 104 are configured so that one or the other of the two transistors is on while the other one is off. The transistor that is on will draw some current from the power supply 110 through the respective resistor. As long as the power us supplied from power supply 110, the transistors 102 and 104 will maintain their state if the control lines are not changed.

The state of the cell may be determined by bringing the WL 118 line high so that the transistor 112 may cause the state of node 107 to change the state of BL 107. The state of the cell may be read on BL 107.

Figure 2:
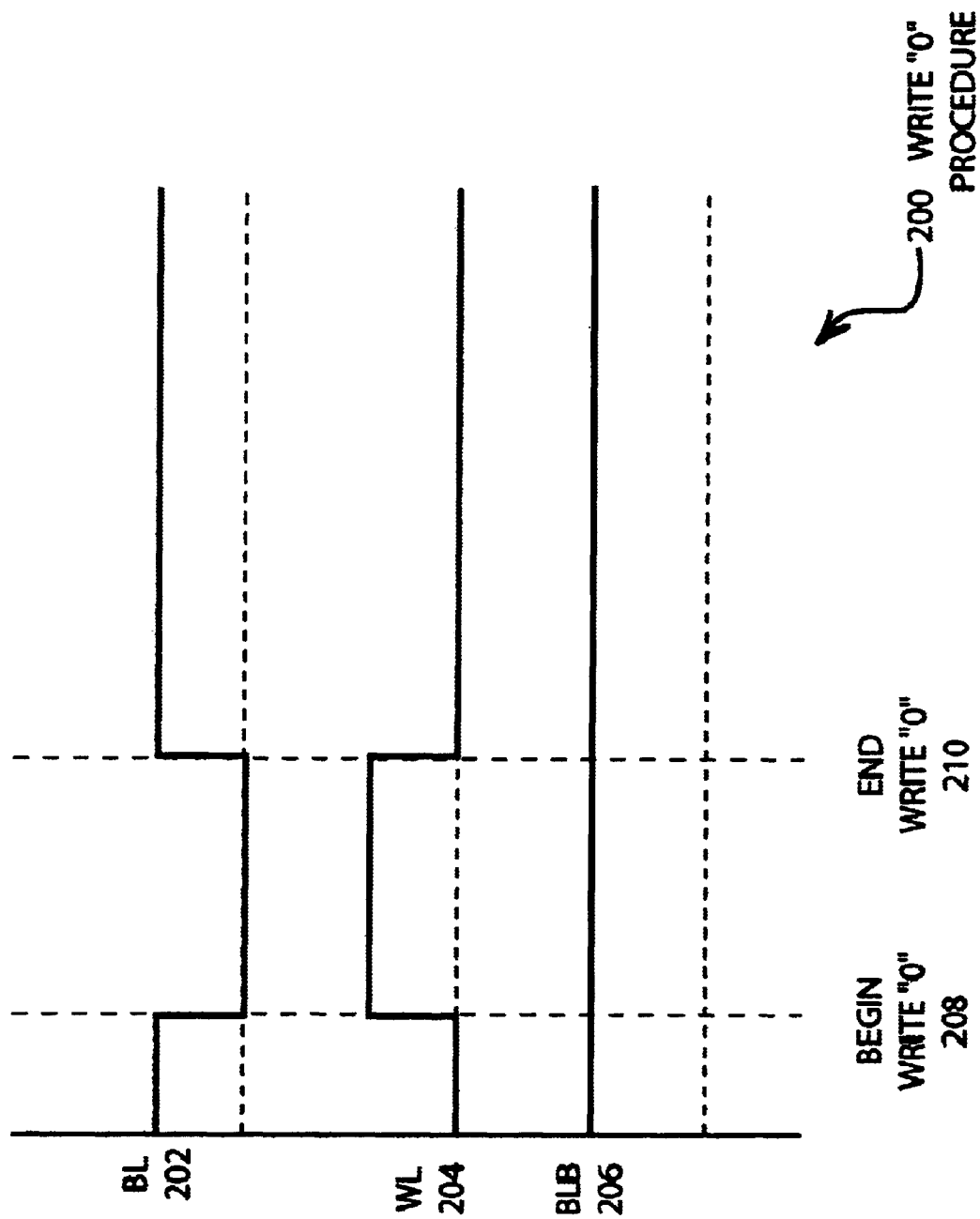
FIG. 2 is an illustration of a time line of the states of the control signals for performing a write '0' operation on the embodiment shown in FIG. 1.

FIG. 2 illustrates a time line 200 of the states of the control signals BL 202, WL 204, and BLB 206. Before the point in time 208 when the write process occurs, the BL 202 line is high, the WL 204 line is low, and the BLB 206 line is high. In order to write a 0 bit to the cell, the BL 202 line is brought low as the WL 204 line is brought high. After some period of time, the BL 202 line is returned high and the WL 204 line is brought low.

In order to explain the effects of the control signals in FIG. 2, the reader's attention is directed to FIG. 1. The voltage at node 107 begins the process at the VDD voltage while node 109 is at zero volts. Transistor 104 is in saturation. WL 118 is brought high so that the transistor 112 will effectively connect BL 116 with node 107. As node 107 is brought low, the transistor 102 enters a linear region, as does the transistor 104. When node 107 is reaches zero volts, the transistor 104 is fully saturated and transistor 102 is open. When WL 118 is brought back to zero volts, the states of transistors 102 and 104 persist due to the current drawn through transistor 104. When WL 118 is brought high, the state of the cell can be read through line BL 116.

Figure 3:
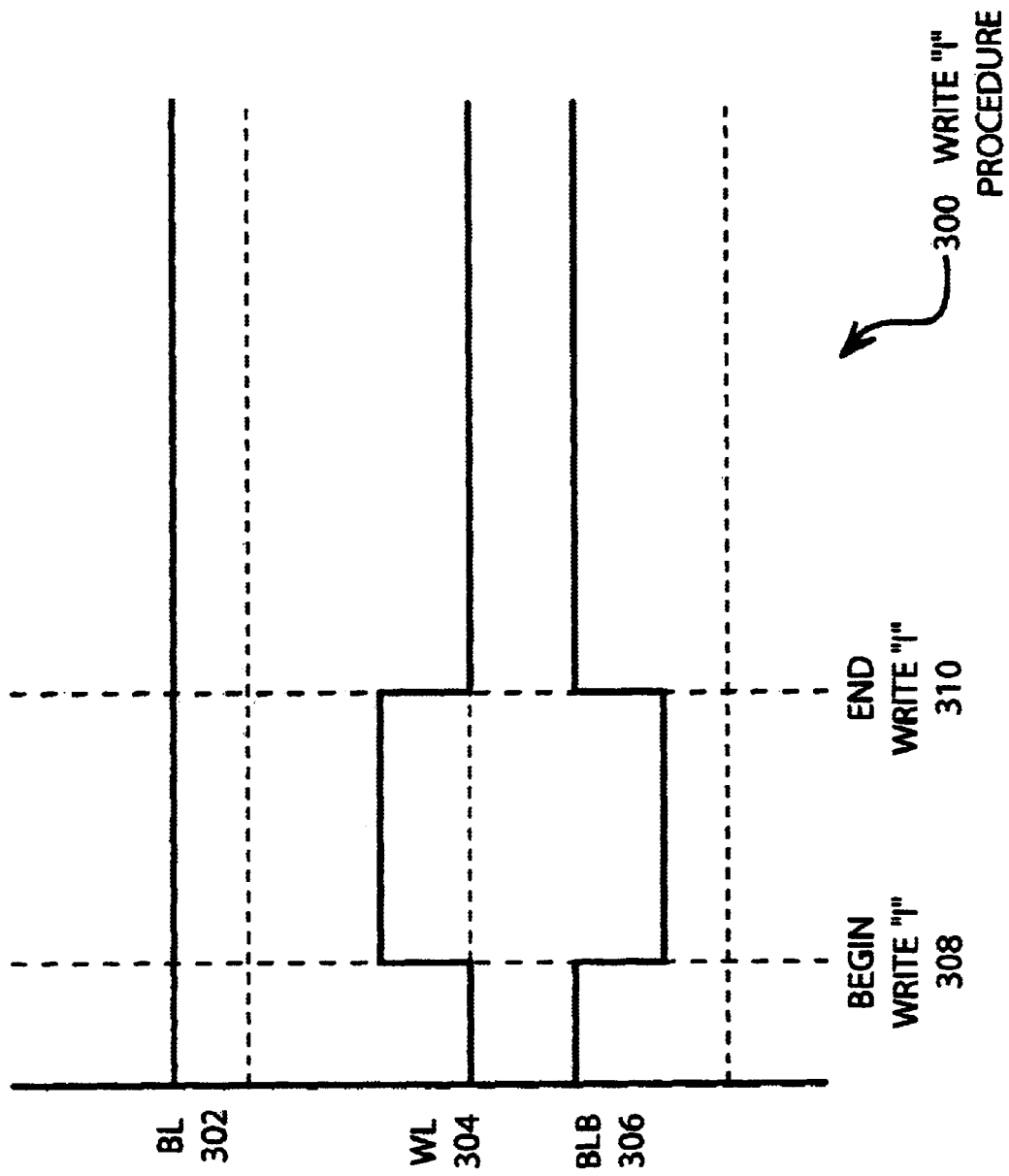
FIG. 3 is an illustration of a time line of the states of the control signals for performing a write '1' operation on the embodiment shown in FIG. 1.

FIG. 3 illustrates a time line 300 of the states of the control signals BL 302, WL 304, and BLB 306. Before the point in time 308 when the write process occurs, the BL 302 line is high, the WL 304 line is low, and the BLB 306 line is high. In order to write a 1 bit to the cell, the BL 302 is kept high, the WL 304 line is brought high, and the BLB 306 line is brought to one half of the nominal high voltage. After some period of time, all of the lines 302, 304, and 306 are brought back to their normal states.

In order to explain the effects of the control signals in FIG. 3, the reader's attention is again directed to FIG. 1. The voltage at node 107 begins the process at zero volts, while the node 109 is at the VDD voltage. Transistor 104 is in saturation. WL 118 is brought high with BL 116 at the same time that BLB 120 is brought low. In some embodiments BLB 120 may be brought low to approximately one half of the VDD voltage. The voltage at node 107 begins to rise, causing the transistor 104 to begin to close, while the transistor 102 begins to open. As the voltage at node 107 approaches VDD, the transistor 104 closes, allowing current through transistor 104 and through the gate of transistor 102. The control lines are then restored to their normal positions and the state of the transistors 102 and 104 will remain.

The three transistor SRAM cell may be useful for designs where space on an integrated circuit is a premium or where the elimination of a control line is desired. In such cases, the three transistor SRAM may have particular advantage over conventional six transistor configurations.

Different variations of the three transistor SRAM cell may be used by those skilled in the arts while keeping within the spirit and intent of the present invention. While the present embodiment may be applicable to integrated circuit technology, various other constructions may be possible, including discrete transistor and resistor components. Various sizes of transistors and resistors, with various power requirements and capacities, shielding, or other features may be used by those skilled in the arts. The values of the pair of resistors may be varied in order to meet certain performance characteristics, as well as other changes and alterations, while keeping within the spirit and intent of the present invention.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A static random access memory device comprising:
    a first transistor having a drain, a gate, and a source;
    a second transistor having a drain connected to said gate of said first transistor and a gate connected to said drain of said first transistor;
    a ground signal connected to said source of said first transistor and said source of said second transistor;
    a third transistor having a drain, a gate, and a source, said drain of said third transistor connected to said drain of said first transistor;
    a first resistor having a first connection and a second connection, said first connection of said first resistor being connected to said drain of said first transistor;
    a second resistor having a first connection and a second connection, said first connection of said second resistor being connected to said drain of said second transistor;
    a first power supply being connected to said second connection of said first resistor and said second connection of said second resistor;
    a second power supply being connected to said source of said third transistor;
    a first signal line connected to said gate of said third transistor;
    a second signal line connected to said second connection of said first resistor; and
    a third signal line connected to said source of said third transistor.

2. The device of claim 1 wherein device is constructed as part of an integrated circuit.

3. The device of claim 1 wherein said first resistor has a first resistance and said second resistor has a second resistance, said first resistance and said second resistance being approximately the same resistance.

4. A method of manufacturing a static random access memory device comprising:
    providing a first transistor having a drain, a gate, and a source;
    providing a second transistor having a drain, a gate, and a source;
    connecting said drain of said second transistor to said gate of said first transistor;
    connecting said drain of said first transistor to said gate of said second transistor;
    providing a ground signal;
    connecting said ground signal to said source of said first transistor and said source of said second transistor;

providing a third transistor having a drain, a gate, and a source;

connecting said drain of said third transistor to said drain of said first transistor;

providing a first resistor having a first connection and a second connection;

connecting said first connection of said first resistor to said drain of said first transistor;

providing a second resistor having a first connection and a second connection;

connecting said first connection of said second resistor to said drain of said second transistor;

providing a first power supply;

connecting said second connection of said first resistor and said second connection of said second resistor to said first power supply;

providing a second power supply;

connecting said source of said third transistor to said second power supply;

providing a first signal line;

connecting said first signal line to said gate of said third transistor;

providing a second signal line;

connecting said second signal line to said second connection of said first resistor;

providing a third signal line; and connecting said third signal line to said source of said third transistor.

5. The method of claim 4 wherein said method is constructed as part of an integrated circuit.

6. The method of claim 4 wherein said first resistor has a first resistance and said second resistor has a second resistance, said first resistance and said second resistance being approximately the same resistance.

* * * * *